US006960961B2

(12) United States Patent
Andrews

(10) Patent No.: US 6,960,961 B2
(45) Date of Patent: *Nov. 1, 2005

(54) EMI REDUCTION OF OSCILLATING SIGNALS BY WAY OF CONTROLLED RANDOMIZED MODULATION

(75) Inventor: Michael Andrews, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 72 days.

This patent is subject to a terminal disclaimer.

(21) Appl. No.: 10/426,483

(22) Filed: Apr. 30, 2003

(65) Prior Publication Data

US 2004/0217822 A1 Nov. 4, 2004

(51) Int. Cl.⁷ .......................... H01H 31/02; H03B 5/36
(52) U.S. Cl. .................. 331/18; 331/19; 331/34; 331/104; 375/1; 375/99; 375/96; 375/103; 375/7; 455/114; 455/317
(58) Field of Search ................ 375/99, 1, 96, 375/103, 7; 455/317, 114; 331/18, 19, 34, 104, 107 T

(56) References Cited

U.S. PATENT DOCUMENTS

| | | |
|---|---|---|
| 5,216,713 A | 6/1993 | Lindholm |
| 5,263,055 A | 11/1993 | Cahill |
| 5,321,409 A | 6/1994 | Walker |
| 5,488,627 A | 1/1996 | Hardin et al. |
| 6,021,054 A | 2/2000 | Ueki |
| 6,031,299 A | 2/2000 | Stumfall |
| 6,031,366 A | 2/2000 | Mitsuishi |
| 6,031,414 A | 2/2000 | Kitamura |
| 6,058,030 A | 5/2000 | Hawkes |
| 6,075,716 A | 6/2000 | He |
| 6,784,625 B1 * | 8/2004 | Andrews .................. 315/276 |

OTHER PUBLICATIONS

J.H.B. Deane et al., "Improvement of power supply EMC by Chaos", Jun. 6, 1996, vol. 32, No. 12, p. 1045.
R. Giral et al., "Current control technique for improving EMC in power converters", Mar. 1, 2001, vol. 37, pp. 274–275.
Y. Nishio et al., "Extremely Simple Hyperchaos Generators Including One Diode", 1992, IEEE, pp. 2797–2800.
Aleksandar M. Stankovic et al., "Randomized Modulation in Power Electronic Converters", May 2002, Proceedings of the IEEE, vol. 90, No. 5, pp. 782–799.
Manuel Delgado–Restituto, et al., "Integrated Chaos Generators", May 2002, Proceedings of the IEEE vol. 90, No. 5, pp. 747–767.
R. Rovatti, et al., "Chaos–Based FM of Clock Signals for EMI REduction", 14th European Conference on Circuit Theory and Design 1999, pp. 373–376.
Herbert L. Krauss, et al., "Solid State Radio Engineering", 1980, Chapter 15, pp. 483–485.
R. Rovatti, G. Setti, S. Graffi, "Chaos–Based FM of Clock Signals for EMI Reduction" 14th European Conference on Circuit Theory and Design (ECCTD '99) pp 373–376.

* cited by examiner

*Primary Examiner*—Michael B Shingleton

(57) ABSTRACT

An electrical circuit generates an oscillating signal that produces reduced electromagnetic interference by way of modulation of the frequency of the oscillating signal within a specified frequency range. A randomized signal generator creates a randomized signal, which is then used to drive a frequency range converter that is employed to produce a frequency modulation signal. The current state of the frequency modulation signal is based on the current state of the randomized signal, with the converter limiting the current state of the frequency modulation signal so that the oscillating signal will only operate within the specified frequency range. A variable frequency oscillator then generates the oscillating signal whose frequency is based on the current state of the frequency modulation signal.

29 Claims, 6 Drawing Sheets

EMI REDUCTION OF OSCILLATING SIGNALS BY WAY OF CONTROLLED RANDOMIZED MODULATION

BACKGROUND OF THE INVENTION

Most modern electronic devices manufactured today contain at least one electrical signal line which is an unwanted source of electrical "noise", thereby adversely affecting other electronic circuits, both within and external to the electronic device. Generally speaking, this noise exists in the form of electromagnetic interference (EMI) of nearby electrical signals by the offending electrical signal. This EMI may be conducted from the offending electrical signal line to others by way of an electrically conductive path. Alternately, the interference may be radiated from the offending electrical signal line to nearby circuits without the benefit of a directly conductive connection. Oftentimes, the result of such radiated or conducted noise is erroneous or improper operation of the circuit being affected by the EMI, due primarily to unexpected voltage changes in the affected circuit. As a result, protecting electrical circuits from EMI that is generated by other signal lines has long been an important facet of the electronic circuit and device design process.

One example of a source of such noise is a digital clock signal, which is an internally generated oscillating signal that is commonly employed to drive and synchronize various circuits, such as microprocessors, peripheral controllers, and other logic integrated circuits (ICs) within an electronic device. Such clock signals typically take the form of a square wave operating at a specific frequency, thus often generating substantial noise at that fundamental frequency and at various harmonics of the fundamental frequency. These clock signals often are required at numerous locations within an electronic device, requiring extensive routing throughout the device, as well as multiple signal drivers due to the extensive number of circuits such a signal often must drive. Thus, the task of reducing the effects of such a widely distributed high-frequency signal to reduce the deleterious effects of the signal on surrounding circuitry is problematic at best. Furthermore, as electronic technology progresses, newer electronic devices tend to utilize clock signals with higher frequencies than those devices of previous technological generations, making the task of mitigating the effects of the generated noise even more difficult.

Several methods of protecting circuits from EMI generated by these oscillating signals have been employed previously. Many such methods involve protecting the sensitive circuits of the electronic device from the noisy signal source. For example, the electronic circuit designer often attempts to structure the physical layout of the electronic circuits on a printed circuit board (PCB) so that the generated EMI of the noisy signal will have an attenuated effect on other surrounding circuits. Such efforts include physically routing the offending signal remotely from other sensitive signal lines and circuits, utilizing additional ground planes within the PCB to electrically shield and separate the noisy signal from surrounding circuits, and the like. Unfortunately, such efforts normally require exorbitant amounts of a PCB designer's time and effort, and are also error-prone, requiring multiple circuit design revisions in order to reduce sufficiently the effects of the noise on the device.

Other similar solutions involve more substantive circuit additions to shield radiated and conducted noise from circuits that are sensitive to that noise. These additions include the use of large and complex filters on the PCB, chokes, additional metal shielding, shielded cables, and so on.

In contrast to the solutions above, more recent approaches to the problem involve changing the nature of the offending clock signal itself to make that signal less of a noise source to surrounding circuitry. For example, one proposed solution has been to "dither" the clock signal by adding a small noise signal to the clock signal itself. Dithering of the clock signal results in displacing the frequency spectrum of the offending noise a small amount, but does not lower the power level of the frequency spectrum. This solution has been utilized in devices in which other circuits within the device are sensitive to noise at particular frequencies, because the small displacement in the frequency spectrum of the clock signal may aid in reducing the effects of the clock noise on that circuit. However, many electronic devices are susceptible to noise across a wide range of frequencies, making this solution inapplicable in such cases. For example, dithering of the clock signal is particularly ineffective for electronic devices such as electronic test and measurement instruments, which often are employed to investigate electronic signals over a very wide band of the frequency spectrum.

Other prior art solutions, such as those indicated in "Current control technique for improving EMC in power converters," ELECTRONIC LETTERS, Vol. 37, No. 5, pp. 274–275 (Mar. 1, 2001) by Giral et al., and "Improvement of power supply EMC by chaos," ELECTRONIC LETTERS, Vol. 32, No 12, p. 1045 (Jun. 6, 1996) by Deane et al., focus on the use of chaotic control of direct-current to direct-current (DC-DC) power converters to reduce the electromagnetic interference normally generated by such circuits. Such solutions succeed in reducing the peaks of the frequency spectrum due to the switching signal associated with such converters by spreading out the power of the spectrum at the fundamental and harmonic frequencies. However, such solutions typically do not ensure failsafe operation of the circuit being driven by the offending signal due to its chaotic nature. For example, in the case of the DC-DC power converter, an inductor is employed as an energy storage element that is intermittently energized by way of a switch. The operation of the switch is controlled by way of a small control circuit that is normally driven by a periodic signal, conditioned by the voltage output of the converter. Adding chaotic control as described by the prior art does not guarantee that the switch will not remain in the closed position, thus potentially causing permanent damage to the inductor by way of sustained electrical current. Similar restrictions normally apply to other periodic signals, such as digital clock signals, which typically must operate within a few percent of a specified frequency.

Another solution, identified by Cahill in U.S. Pat. No. 5,263,055, entitled "APPARATUS AND METHOD FOR REDUCING HARMONIC INTERFERENCE GENERATED BY A CLOCK SIGNAL", implements a periodic clock signal that is frequency modulated, or alternately, phase modulated, by the output of a pseudorandom noise signal generator. While the power spectral energy of the fundamental and harmonic frequencies of the periodic clock signal is reduced, no control mechanism is present which ensures that the changing frequency of the modulated signal remains within the limits required of the circuit being driven by that signal.

From the foregoing, despite previous attempts to mitigate or reduce EMI generated by periodic electronic signals, a need still exists for a reliable method of reducing the EMI generated by oscillating signals exhibiting at least some degree of periodic behavior. Such a method should both reduce the EMI generated by the oscillating signal while ensuring that the signal retains the characteristics required for proper operation of the circuits it drives.

SUMMARY OF THE INVENTION

Embodiments of the invention, to be discussed in detail below, provide an electrical circuit for generating an oscillating signal having a modulated frequency that operates within a specified frequency range. A randomized signal generator is employed to create a randomized signal used as input for a frequency range converter. The converter, in turn, produces a frequency modulation signal, the current state of which is based on the current state of the randomized signal. Additionally, the converter limits the current state of the frequency modulation signal so that the oscillating signal that is ultimately produced will operate within the specified frequency range. A variable frequency oscillator then generates the oscillating signal, the frequency of which is based on the current state of a frequency modulation signal.

By modulating the frequency of the oscillating signal in this manner, the overall EMI produced is reduced in comparison to oscillating signals of a fixed frequency. Furthermore, by restricting the frequency of the oscillating signal to the specified frequency range, the proper operation of the circuits driven by the oscillating signal is maintained.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
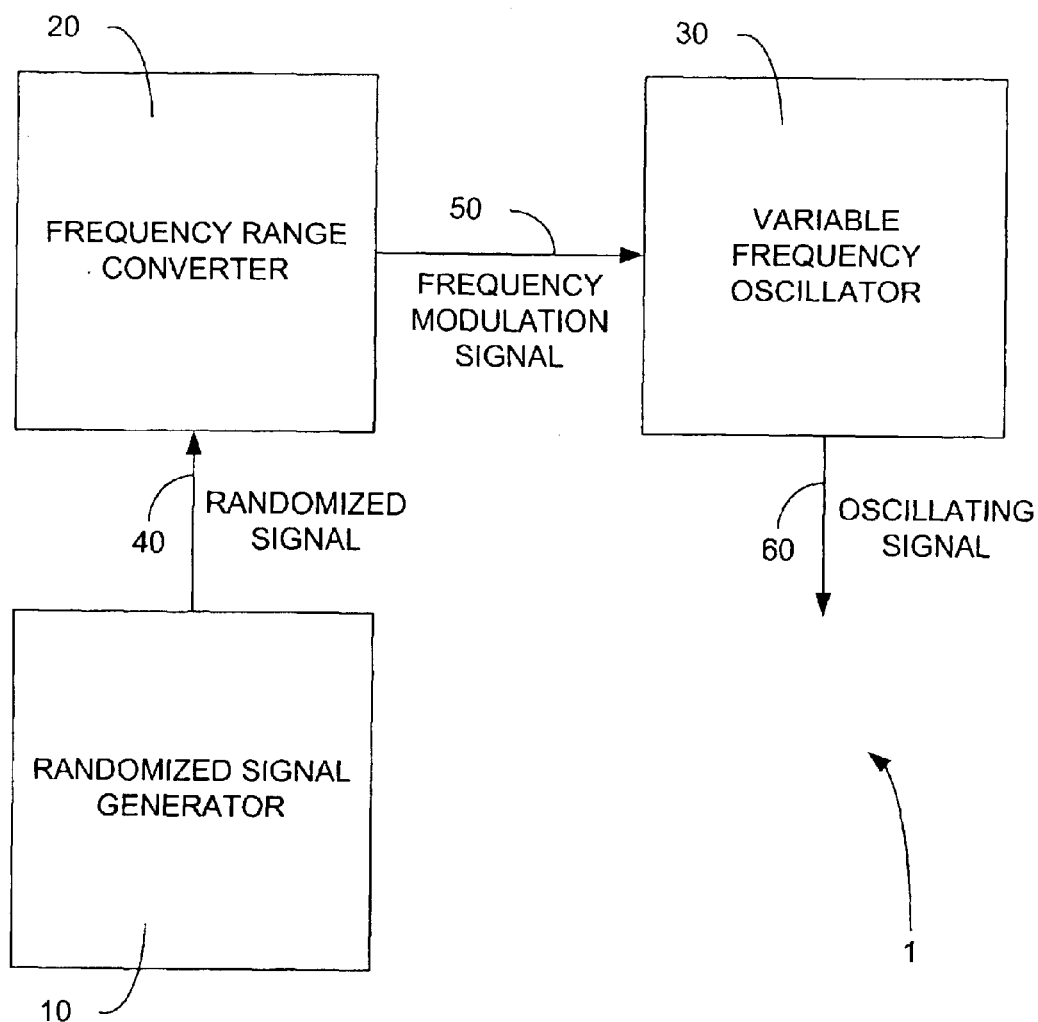
FIG. 1 is a high-level block diagram of an electrical circuit according to an embodiment of the invention that generates an oscillating signal.

An example of an electrical circuit 1 for generating a reduced-EMI oscillating signal according to an embodiment of the invention is shown in FIG. 1. Generally speaking, a randomized signal generator 10 is employed to generate a randomized signal 40, which is then transferred to a frequency range converter 20. The frequency range converter 20 then produces a frequency modulation signal 50 based on the current state of the randomized signal 40. The current state is the current value of the particular characteristic of the signal that is being randomized. In the following embodiments, voltage is the randomized characteristic, but others, such as current, frequency, and phase may also be utilized. The frequency modulation signal 50 then drives a variable frequency oscillator 30, which generates an oscillating signal 60 that has a frequency based on the current state of the frequency modulation signal 50. To ensure that the oscillating signal 60 remains within a specified frequency range, the frequency range converter 20 limits the frequency modulation signal 50 so that the frequency of the oscillating signal 60 always operates within that frequency range. That frequency range is determined by the technical requirements of the circuit being driven by the oscillating signal 60, the particular application in which that circuit is employed, and other factors.

Concerning the randomized signal generator 10, the randomized signal 40 exhibits characteristics similar to what is commonly termed "white noise." In the context of the present invention, white noise is an electrical signal that possesses a continuous, uniform power spectral density over a particular frequency range. However, the randomized signal 40 need not exhibit complete or perfect uniformity in its power spectral density for most embodiments of the present invention, as sufficient reduction in EMI exhibited by the oscillating signal 60 ordinarily results from a less-than-perfect randomized signal 40.

Figure 2:
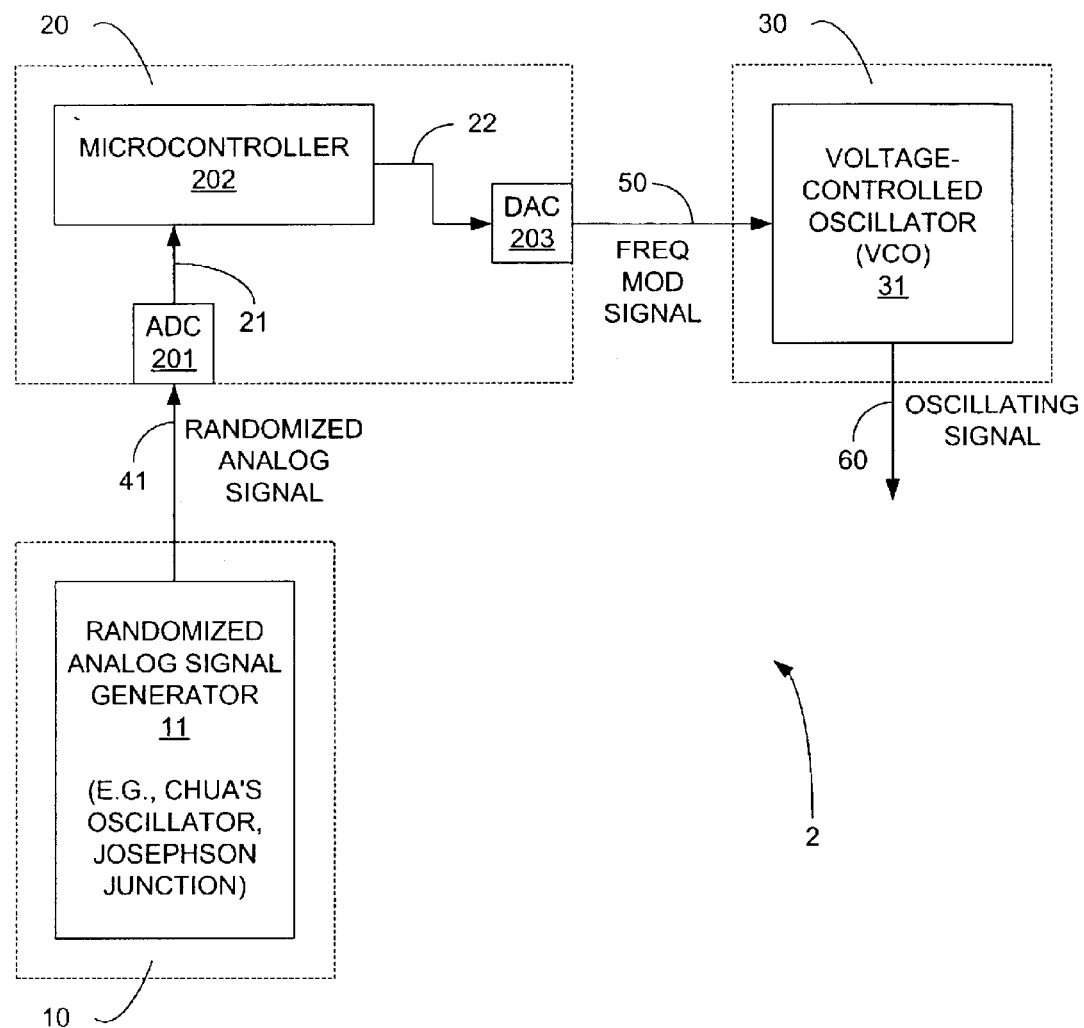
FIG. 2 is a more detailed block diagram of an electrical circuit according to an embodiment of the invention that generates an oscillating signal.

The randomized signal 40 generated by the randomized signal generator 10 may be, for example, a randomized analog signal 41 (as shown in FIG. 2), the voltage of which varies with time. In this case, the voltage of the randomized analog signal 41 would be used for modulation purposes, as described below. Thus, in such an embodiment, the randomized signal generator 10 would be a randomized analog signal generator 11 (also shown in FIG. 2).

Many different types of electrical circuits that generate noise could be employed for the randomized analog signal generator 11. For example, a Josephson junction may be used for such a purpose. A Josephson junction, as described in the prior art, is a small circuit consisting of two layers of superconductor material separated by a thin nonsuperconductor. Although the Josephson junction is known primarily for extremely high switching speeds at very low temperatures, the thermal noise demonstrated by such a junction at higher temperatures is highly nonlinear and randomized in nature.

Another type of randomized analog signal generator 11 is Chua's oscillator, a nonlinear, chaotic oscillator well known in the art. Chua's oscillator also possesses the added advantage of producing a randomized analog signal 41 whose frequency range may be limited with proper selection of the values of the circuit components, such as resistors and capacitors, which make up the oscillator. Many other similar electrical circuits that generate randomized or chaotic electrical analog signals may also be employed as the randomized analog signal generator 11.

Figure 3:
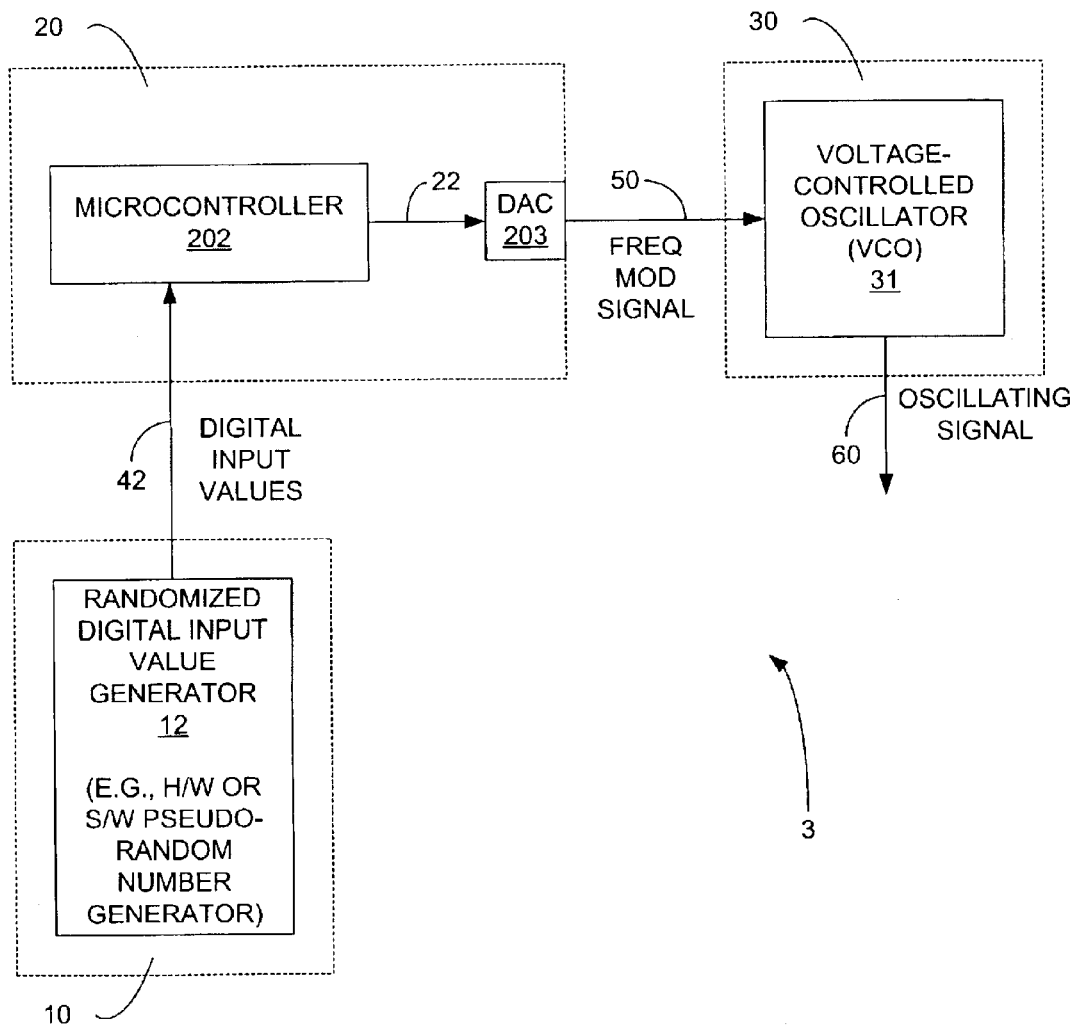
FIG. 3 is a more detailed block diagram of an electrical circuit according to another embodiment of the invention that generates an oscillating signal.

The randomized signal 40 may also take the form of a series of randomized digital input values 42 generated by another type of randomized signal generator 10: a randomized digital input value generator 12, as shown in FIG. 3. For example, a hardware random or pseudorandom number generator may be employed to generate the series of randomized digital input values 42. Hardware random number generators normally utilize some randomized physical process, such as a thermal noise generation circuit, to generate a series of random numbers. Hardware pseudorandom number generators employ a hardware implementation of a mathematical algorithm to generate a series of numbers that appear quite random, but are still deterministic if enough is known about the algorithm. Hardware random and pseudorandom number generators may be embodied in field-programmable gate arrays (FPGAs), application-specific integrated circuits (ASICs) or similar integrated circuits (ICs). Also, a software implementation of a pseudorandom number generator may also be employed. Such software algorithms are commonly performed using, for example, a microcontroller, which may be a microprocessor or similar computer-based circuit capable of running a computer program or algorithm.

The randomized signal 40 generated by the randomized signal generator 10 is then used to drive a frequency range converter 20. In the embodiment of FIG. 2, in which a randomized analog signal 41 is employed, an analog-to-digital converter (ADC) 201 is used to periodically convert the randomized analog signal 41 into a series of digital input values 21 for use by a microcontroller 202. The microcontroller 202 then generates a digital output value 22 based on each digital input value 21 received from the ADC 201. Each digital output value 22 is then converted back to an analog voltage by way of a digital-to-analog converter (DAC), thus creating the frequency modulation signal 50.

The frequency range converter 20 ensures that no digital output value 22 causes the oscillating signal 60 of the variable frequency oscillator 30 to operate outside the specified frequency range. A simple method for meeting this requirement is to pass all digital input values 21 unmodified as digital output values 22 that result in a proper frequency for the oscillating signal 60. For those digital input values 21 that do not result in a proper frequency for the oscillating signal 60, the frequency range converter 20 may "clip" impermissibly high digital output values 22 so that the frequency modulation signal 50 causes the generation of the oscillating signal 60 at the highest allowable frequency within the specified range. Likewise, impermissibly low digital output values 22 may be "boosted" so that the frequency of the oscillating signal 60 is no lower than that allowed. Optionally, those digital input values 21 that fall outside of a prescribed range may be "mapped" to other values within the range. Such mapping may be either constant or variably dependent on previous digital input values 21 received by the frequency range converter 20.

More sophisticated methods of ensuring that the frequency of the oscillating signal 60 remains within its specified range may also be employed. For example, if the ultimate range of digital input values 21 is known with certainty, the frequency range converter 20 may then "scale" the digital input values 21 to a broader or narrower range of digital output values 22 so that the range of digital output values 22 being produced closely matches the frequency range specified for the oscillating signal 60. Optionally, clipping and boosting may then be applied atop this scaling algorithm to ensure that the frequency restrictions of the oscillating signal 60 are met.

Other algorithms that produce digital output values 22 based on the digital input values 21 that allow the oscillating signal 60 to operate within the specified frequency range may also be employed.

As noted above, in the embodiment shown in FIG. 3, the frequency range converter 20 may receive a series of randomized digital input values 42. In that particular case, the microcontroller 202 receives these values directly, as opposed to being converted by an ADC. Furthermore, if the randomized digital input values 42 are generated by a software algorithm on a microcontroller, a single microcontroller may serve as both the randomized digital input value generator 12 and the microcontroller 202 of the frequency range converter 20, thus reducing the amount of hardware required to implement this particular embodiment of the invention.

In some embodiments, the frequency range may be predetermined by being permanently set within the design of the frequency range converter 20 of the electrical circuit 1. This type of embodiment would be appropriate for cases in which the range of operation of the circuit is known at the time of the design. In other embodiments, the use of a modifiable frequency range, allowing programmability of both the extent of the allowed frequency range, and its location within the frequency spectrum, may be desirable. For example, in the case of a test and measurement instrument employed to analyze electrical signals at a variety of frequencies, control over the allowed frequency range of the oscillating signal 60 may be desirable, with the range being dependent on the frequency range of the signals being analyzed at a particular time.

Similarly, alternate embodiments of the present invention may also allow either a modulated version of the oscillating signal 60, as described above, or an unmodulated oscillating signal 60 operating at some fundamental frequency. This option may be desirable in circumstances where operation of the circuits driven by the oscillating signal 60 at a single frequency are desirable whenever possible.

The frequency modulation signal 50, produced by the frequency range converter 20, then drives a variable frequency oscillator 30, which generates the oscillating signal 60, the frequency of which depends on the current state of the frequency modulation signal 50. In the embodiments of the electrical circuit 2, 3, shown in FIG. 2 and FIG. 3, the variable frequency oscillator 30 is a voltage-controlled oscillator (VCO) 31. As is well known in the art, a VCO generates an output signal of a particular frequency based on the voltage present at the input of the VCO, with a higher voltage causing the output to operate at a higher frequency. Thus, as the voltage of the frequency modulation signal 50 increases or decreases, the frequency of the oscillating signal 60 tracks those changes.

Figure 4:
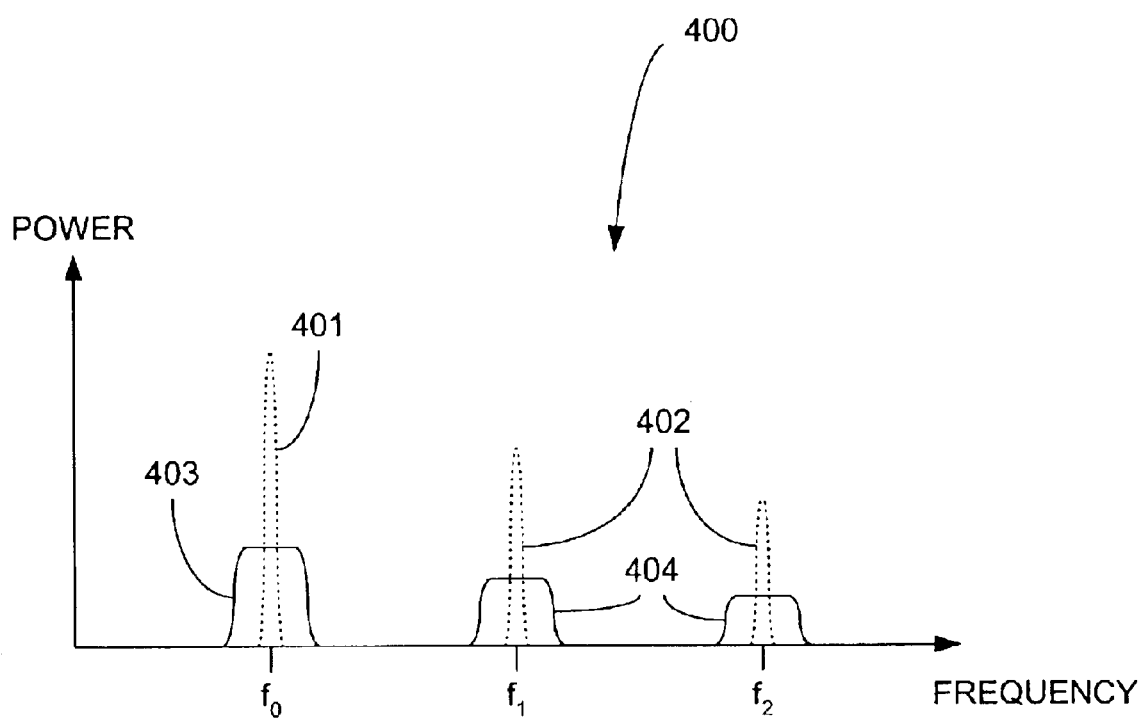
FIG. 4 is a simplified power spectral density graph representing the expected reduction in EMI by modulation of the oscillating signal by an electrical circuit according to an embodiment of the invention.

The effect of embodiments of the invention on the power spectral density of the oscillating signal 60 is shown by way of a simplified frequency spectrum chart 400 in FIG. 4. The dashed waveform indicates the typical power spectral density of an unmodulated clock signal, consisting of a spike 401 at a fundamental frequency $f_0$, which is the frequency at which the unmodulated clock signal operates. Assuming that the unmodulated clock signal is not a perfect sinusoidal wave, spikes 402 at harmonics of the fundamental frequency, shown in FIG. 4 as $f_1$ and $f_2$, will also be present. As discussed above, the magnitude of the power of the unmodulated clock signal at those frequencies $f_0$, $f_1$, $f_2$ is often at sufficiently high levels to cause improper operation of nearby electrical circuits by way of EMI.

Conversely, the magnitude of the power spectral density of the oscillating signal 60, generated by embodiments of the present invention, are much reduced in comparison to those of an unmodulated clock signal. Denoted by the fundamental "bump" 403 and the harmonic bumps 404 in FIG. 4, the reduced magnitude of the power spectral density of the oscillating signal 60 is accomplished by the randomized nature of the modulation performed by embodiments of the invention. This modulations spreads out the frequency range of the fundamental and harmonic frequencies of the oscillating signal 60 while limiting that range of frequencies based on the requirements of the circuit being driven by the oscillating frequency 60. Theoretically, a six-to-twenty decibel (dB) improvement in the noise floor of nearby circuits may be attained by employing embodiments of this invention.

Generally, the specific embodiments discussed above employ the varying nature of the voltage of the randomized signal 40 to ultimately vary the frequency of the oscillating signal 60 to reduce the EMI generated. Signals which exhibit other randomly or pseudorandomly varying characteristics may also be used. For example, a randomized signal 40 with a randomly varying frequency may be utilized to modulate the frequency of the oscillating signal 60. The frequency range converter 20 would then be required to detect the changes in frequency of the randomized signal 40, and produce a frequency modulation signal 50 based on the frequency of the randomized signal 40. As in the embodiments discussed above, the frequency range converter 20 would also be tasked with ensuring that the frequency modulation signal 50 does not force the frequency of the oscillating signal beyond its acceptable range. Additionally, other varying characteristics of a randomized signal, such as current or phase, could also be employed as the randomized variable used for modulation purposes.

Figure 5:
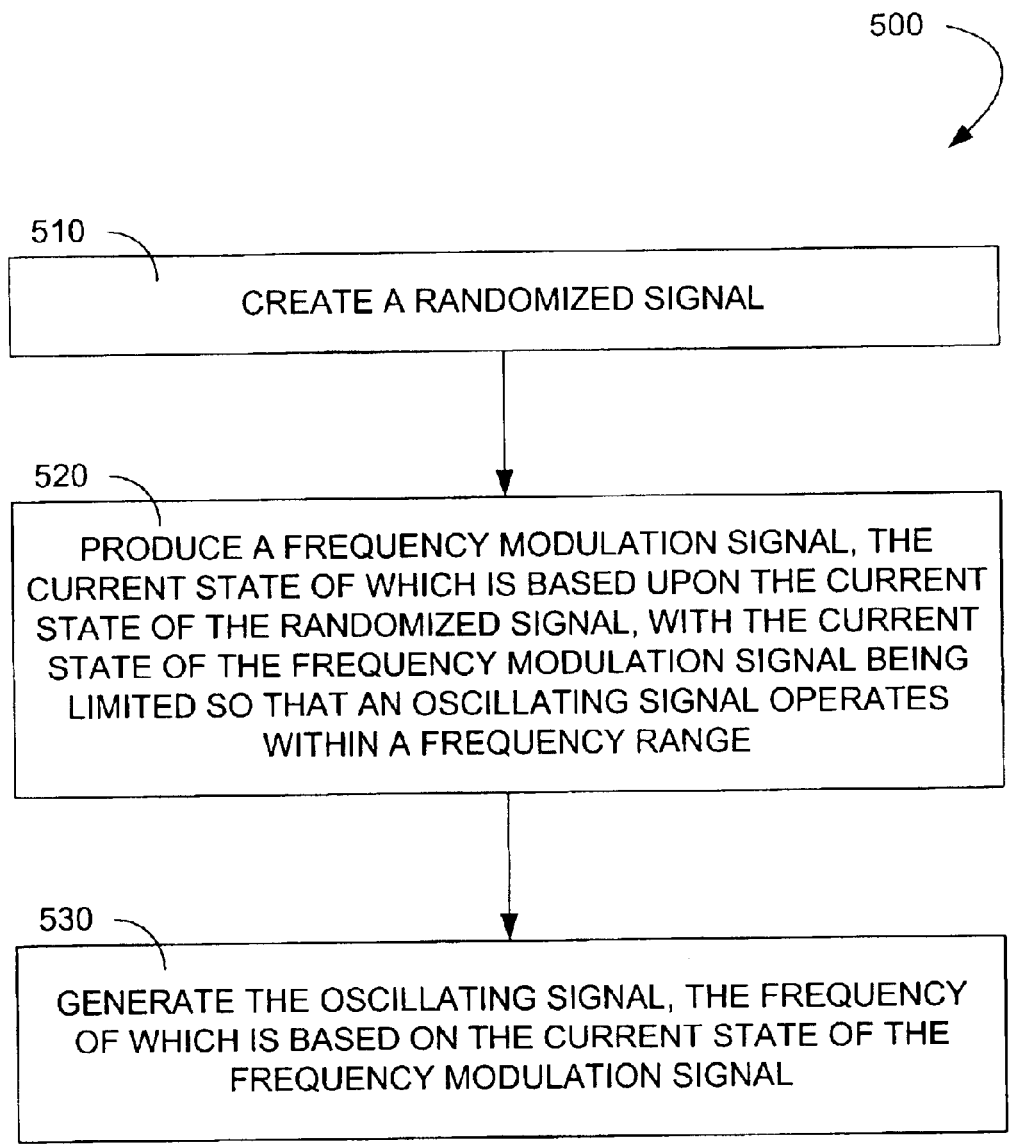
FIG. 5 is a flow diagram of a method according to an embodiment of the invention of generating an oscillating signal.

Embodiments of the present invention may also take the form of a method of generating an oscillating signal exhibiting reduced EMI. As shown in FIG. 5, such a method 500 involves creating a randomized signal (step 510), with some characteristic of that signal, such as amplitude, frequency, or the like, being randomized. Also, as noted above, the randomized signal may be a randomized analog signal or a series of digital input values. A frequency modulation signal, which is based on the current state of the randomized signal, is then produced (step 520). The oscillating signal, the frequency of which is based on the current state of the frequency modulation signal, is then generated (step 530). Further, the frequency modulation signal is limited to ensure the operation of the oscillating signal within a specified frequency range (also step 520), which may be predetermined or modifiable.

Figure 6:
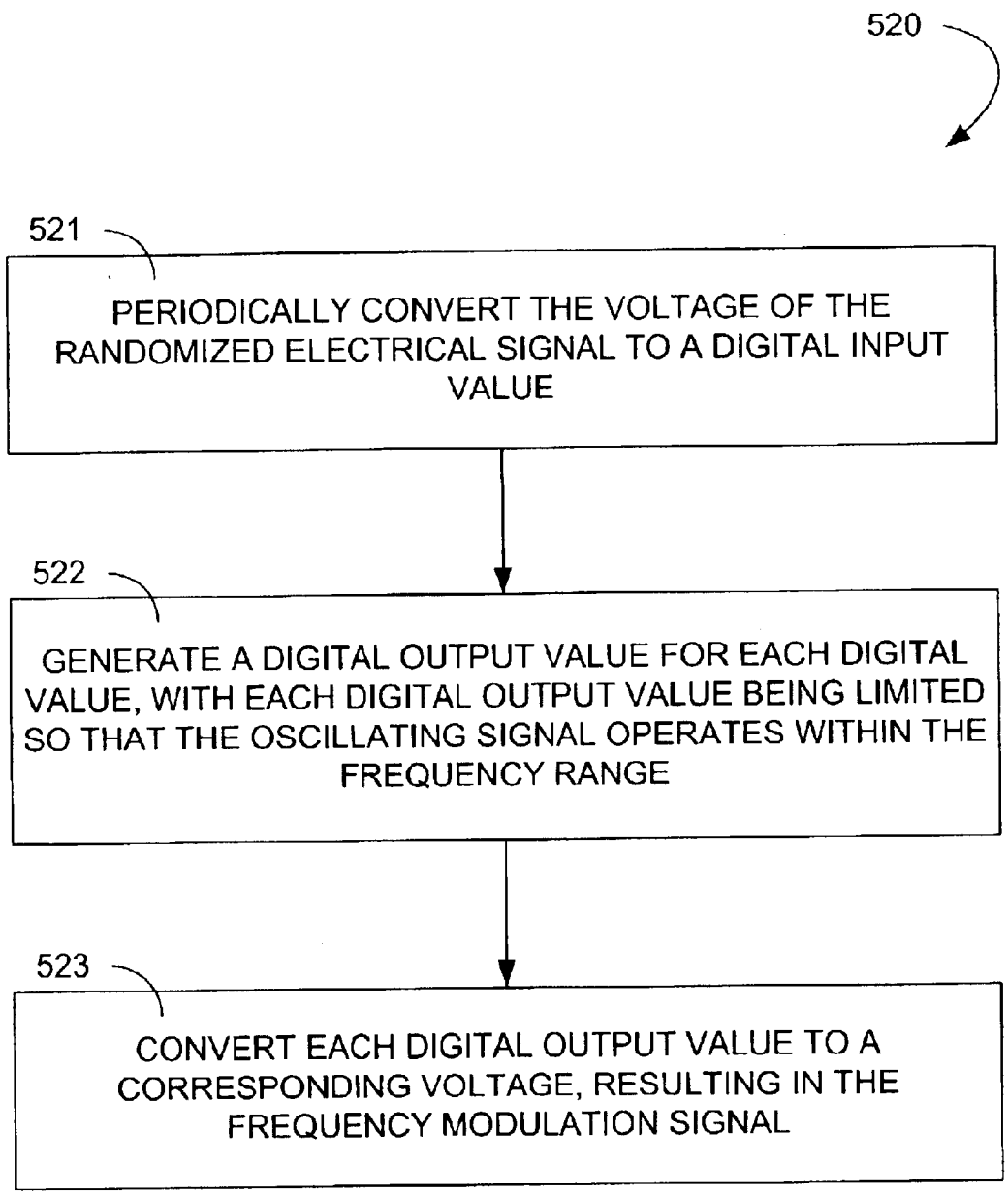
FIG. 6 is a flow diagram further describing the method step of producing a frequency modulation signal from FIG. 5 according to an embodiment of the invention.

In the case of the randomized signal being a randomized analog signal whose voltage exhibits random or pseudorandom behavior, the step of producing the frequency modulation signal (step 520 of FIG. 5) begins with periodically converting the voltage of the randomized signal to a digital input value (step 521 of FIG. 6). A digital output value for each digital input value is then generated (step 522), with each digital output value being limited so that the oscillating signal will operate within the specified frequency range. Methods such as clipping and scaling, described above, as well as others, may be employed. Each of the digital output values is then converted to a corresponding voltage, resulting in the frequency modulation signal (step 523). In the case that the randomized signal is a series of digital input values, the periodically converting step (step 521) would be unnecessary.

In alternate method embodiments, the frequency modulation signal may be held constant at times, causing the oscillating signal to operate at a single frequency, as discussed above.

Again, other method embodiments involving randomized signals possessing different characteristics other than voltage having a randomized quality may be employed, including current, frequency, and phase.

From the foregoing, embodiments of the invention provide an improved electrical circuit and method for generating an oscillating signal, typically used as a digital clock signal, which exhibits reduced EMI, thereby inflicting less noise upon surrounding circuits. Embodiments of the invention other than those shown above are also possible. As a result, the invention is not to be limited to the specific forms so described and illustrated; the invention is limited only by the claims.

What is claimed is:

1. An electrical circuit for generating an oscillating signal having a modulated frequency that produces reduced electromagnetic interference while operating within a frequency range, comprising:
   a randomized signal generator configured to create a randomized analog signal;
   a variable frequency oscillator configured to generate the oscillating signal, the frequency of the oscillating signal being based on a current state of a frequency modulation signal; and
   a frequency range converter configured to produce the frequency modulation signal, the frequency range converter comprising:
       an analog-to-digital converter (ADC) configured to periodically convert the randomized analog signal to a digital input value;
       a microcontroller configured to generate a digital output value for each digital input value, with each digital output value being limited so that the oscillating signal operates within the frequency range; and
       a digital-to-analog converter (DAC) configured to convert each digital output value to the current state of the frequency modulation signal.

2. The electrical circuit of claim 1, wherein the variable frequency oscillator is a voltage-controlled oscillator (VCO), the VCO generating the oscillating signal whose frequency is based on a voltage of the frequency modulation signal.

3. The electrical circuit of claim 1, wherein the randomized analog signal has a voltage which varies with time.

4. The electrical circuit of claim 3, wherein the randomized signal generator is a Josephson junction.

5. The electrical circuit of claim 3, wherein the randomized signal generator is a Chua's oscillator.

6. The electrical circuit of claim 1, wherein the frequency range is predetermined.

7. The electrical circuit of claim 1, wherein the frequency range is modifiable.

8. The electrical circuit of claim 1, wherein the frequency modulation signal is held constant selectably so that the oscillating signal operates essentially at a single frequency.

9. An electronic device containing the electrical circuit of claim 1.

10. The electrical circuit of claim 1, wherein the frequency range converter limits the current state of the frequency modulation signal by clipping ones of said digital values.

11. The electrical circuit of claim 1, wherein the frequency range converter limits the current state of the frequency modulation signal by boosting ones of said digital values.

12. The electrical circuit of claim 1, wherein the frequency range converter limits the current state of the frequency modulation signal by mapping ones of said digital values to other digital values.

13. The electrical circuit of claim 1, wherein the frequency range converter limits the current state of the frequency modulation signal by scaling said digital values.

14. An electrical circuit for generating an oscillating signal having a modulated frequency that produces reduced electromagnetic interference while operating within a frequency range, comprising:
- a randomized signal generator configured to create a series of randomized digital input values;
- a variable frequency oscillator configured to generate the oscillating signal, the frequency of the oscillating signal being based on a current state of a frequency modulation signal; and
- a frequency range converter configured to produce the frequency modulation signal, the frequency range converter comprising:
  - a microcontroller configured to generate a digital output value for each digital input value, with each digital output value being limited so that the oscillating signal operates within the frequency range; and
  - a digital-to-analog converter (DAC) configured to convert each digital output value to the current state of the frequency modulation signal.

15. The electrical circuit of claim 14, wherein the randomized signal generator is a hardware random number generator.

16. The electrical circuit of claim 14, wherein the randomized signal generator is a hardware pseudorandom number generator.

17. The electrical circuit of claim 14, wherein the randomized signal generator is an embedded microcontroller performing a pseudorandom number generation algorithm.

18. An electrical circuit for generating an oscillating signal having a modulated frequency that produces reduced electromagnetic interference while operating within a frequency range, comprising:
- means for generating a series of randomized digital input values;
- means for generating the oscillating signal, the frequency of the oscillating signal being based on a current state of a frequency modulation signal;
- means for generating a digital output value for each digital input value, with each digital output value being limited to cause the oscillating signal to operate within the frequency range; and
- means for converting each digital output value to the current state of the frequency modulation signal.

19. The electrical circuit of claim 18, further comprising:
- means for generating a randomized analog signal, the voltage of which varies with time; and
- means for converting the randomized analog signal to the series of randomized digital input values.

20. The electrical circuit of claim 18, wherein the frequency range is predetermined.

21. The electrical circuit of claim 18, wherein the frequency range is modifiable.

22. The electrical circuit of claim 18, further comprising means for allowing the frequency modulation signal to be held constant selectably so that the oscillating signal operates essentially at a single frequency.

23. An electronic device containing the electrical circuit of claim 18.

24. A method for generating an oscillating signal having a modulated frequency that produces reduced electromagnetic interference while operating within a frequency range, comprising:
- generating a series of randomized digital input values;
- generating a digital output value for each digital input value, with each digital output value being limited to cause the oscillating signal to operate within the frequency range;
- converting each digital output value to a current state of a frequency modulation signal; and
- generating the oscillating signal, the frequency of the oscillating signal being based on the current state of the frequency modulation signal.

25. The method of claim 24, further comprising:
- generating a randomized analog signal, the voltage of which varies with time; and
- converting the randomized analog signal to the series of randomized digital input values.

26. The method of claim 24, wherein the frequency range is predetermined.

27. The method of claim 24, wherein the frequency range is modifiable.

28. The method of claim 24, wherein the frequency modulation signal is held constant selectably so that the oscillating signal operates essentially at a single frequency.

29. An electronic device employing the method of claim 24.

* * * * *